United States Patent [19]
Whiting

[11] Patent Number: 5,819,404
[45] Date of Patent: Oct. 13, 1998

[54] VACUUM PICK UP CAP WITH RETENTIVE FEATURE AND METHOD OF USE

[75] Inventor: David E. Whiting, Etters, Pa.

[73] Assignee: Berg Technology, Inc., Reno, Nev.

[21] Appl. No.: 774,444

[22] Filed: Dec. 30, 1996

Related U.S. Application Data

[60] Provisional application No. 60/009,474 Jan. 2, 1996.
[51] Int. Cl.⁶ .................................................. H01R 9/00
[52] U.S. Cl. .............................................. 29/843; 439/940
[58] Field of Search ................................. 439/135, 940; 29/842, 843

[56] References Cited

U.S. PATENT DOCUMENTS

| | | | |
|---|---|---|---|
| 5,026,295 | 6/1991 | Fong et al. | 439/135 |
| 5,096,428 | 3/1992 | Lwee et al. | 439/79 |
| 5,249,977 | 10/1993 | Tanaka et al. | 439/135 |
| 5,571,022 | 11/1996 | Schaarschmidt | 439/135 |
| 5,681,174 | 10/1997 | Correll, Jr. et al. | 439/135 |

*Primary Examiner*—Neil Abrams
*Assistant Examiner*—Barry M. L. Standig
*Attorney, Agent, or Firm*—Daniel J. Long; M. Richard Page

[57] ABSTRACT

Disclosed is a vacuum pick up cap for use in positioning an electrical receptacle on a printed circuit board (PCB). A vertical projection extends downwardly to engage the receptacle. The width of the projection is increased adjacent its lower terminal edge to prevent the vacuum pick up cap from disengaging from the receptacle when the PCB is inverted in an infrared (IR) conveyor oven during the manufacture of a two-sided PCB. A method of use is also disclosed.

1 Claim, 4 Drawing Sheets

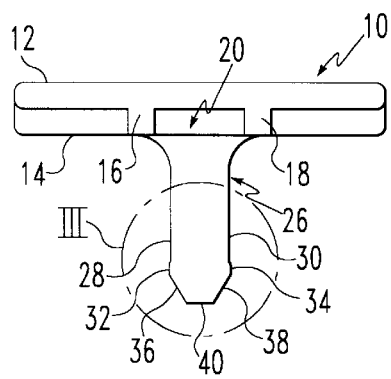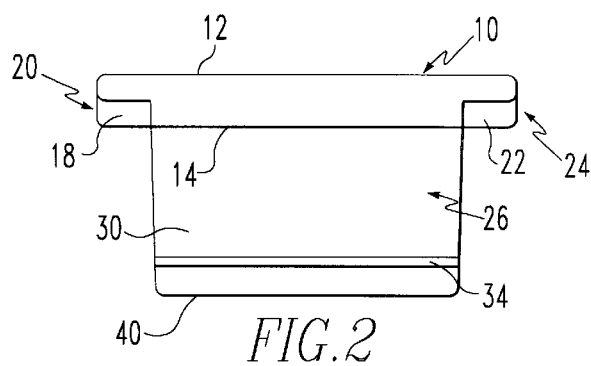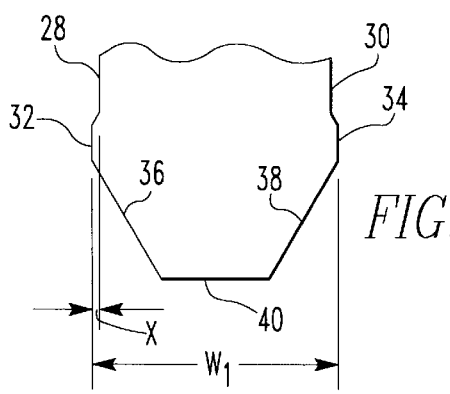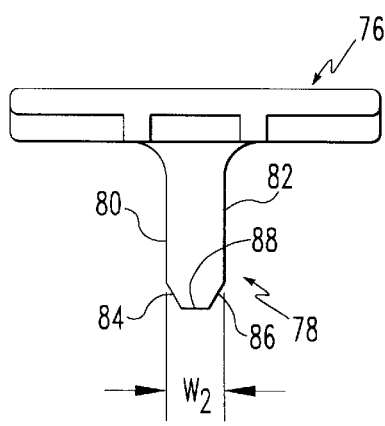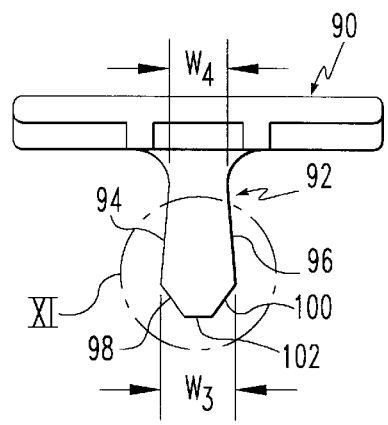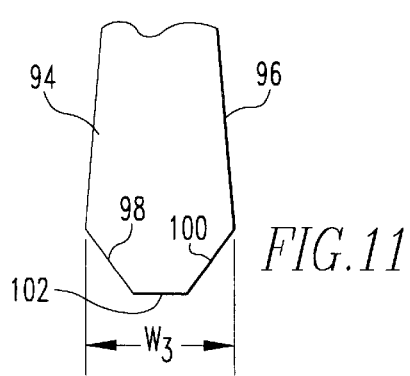

VACUUM PICK UP CAP WITH RETENTIVE FEATURE AND METHOD OF USE

This application claims benefit of U.S. Provisional Application No. 60/009,474, filed Jan. 2, 1996.

BACKGROUND OF THE INVENTION

1. Field of the Invention

The present invention relates to electrical connectors and more particularly to devices used in the manipulation of such connectors during the assembly of electrical and electronic products.

2. Brief Description of Prior Developments

Electronic components are often manipulated for positioning on electrical apparatus as, for example, on a printed circuit board (PCB) by means of vacuum suction nozzles. In the case of electrical receptacles, vacuum pick up is typically facilitated by means of caps which have a flat upper surface and a lower surface from which a projection or projections extend downwardly to engage a medial slot or a plurality of apertures on the upper surface of the receptacle. The caps and attached receptacles are picked up by a vacuum suction nozzle and then placed in an appropriate position on a PCB. After the receptacle as well as all other components have been positioned and attached on the PCB, the vacuum pick up caps will be removed, usually in a manual procedure.

In various miniaturized electronic products such as notebook computers and cellular telephones, electronic components are often mounted on both sides of a PCB in order to save space. In the manufacture of such two-sided PCB's, components are first positioned on one side of the PCB after which the PCB is placed in an infrared IR conveyor oven and heated to reflow solder. After components have been attached to the first side of the PCB, the PCB is then inverted and components are positioned on its reverse side. The PCB is again heated to solder reflow in an IR conveyor oven in order to attach the components to the reverse side. A problem, however, has been found to exist with the above described process in that from time to time vacuum pick up caps which were engaged with receptacles on the first side of the PCB will become disengaged and fall from the receptacles during the IR conveyor oven reflow of the second side of the PCB. Such disengaged vacuum pick up caps may damage the IR conveyor oven or may cause interruptions or inefficiencies in the manufacturing process. For example, these caps may fall into the heating elements of the IR conveyor oven or into its moving parts.

A need, therefore, exists for a means of preventing vacuum pickup caps from becoming disengaged from receptacles during the manufacture of two sided PCB's.

SUMMARY OF THE INVENTION

While not intending to be bound by any particular theory of the operation of the present invention, it is believed that the opposed vertical side walls of the receptacles on the first side of the PCB may become thermally deformed in the IR conveyor oven and may sag slightly outwardly. The slot between these opposed vertical walls, therefore, may tend to become somewhat wider. In the vacuum pick up cap of the present invention, means are provided to compensate for this slightly increased slot width. By slightly increasing the width of the downwardly extending projection on the vacuum pick up cap near its lower terminal edge, it is found, surprisingly and unexpectantly, that vacuum pick up caps become much less likely to be disengaged from their receptacles during the IR conveyor oven heating procedure. Preferably opposed ridges will extend from the lateral sides or the lateral sides will slope outwardly towards the bottom of the projection. Alternatively, other equivalent retentive features may be provided on the downwardly extended projection. For example, recesses may be provided in the lateral side of the projection to provide additional retentive force.

BRIEF DESCRIPTION OF THE DRAWINGS

The vacuum pick up cap of the present invention is further described with reference to the accompanying drawings in which:

FIG. 1 is an end view of a preferred embodiment of the vacuum pick up cap of the present invention;

FIG. 2 is a side elevational view of the vacuum pick up cap shown in FIG. 1;

FIG. 3 is a detailed view in circle III in FIG. 1;

FIG. 10*a* is an end view of a prior art vacuum pick up cap used in a comparative test described hereafter;

FIG. 10*b* is an end view of a vacuum pick up cap representing an alternate preferred embodiment of the present invention which was also used in a comparative test described herein;

FIG. 11 is a detailed view of the area in circle XI in FIG. 10*b*; and

DETAILED DESCRIPTION OF THE PREFERRED EMBODIMENTS

Figure 4:
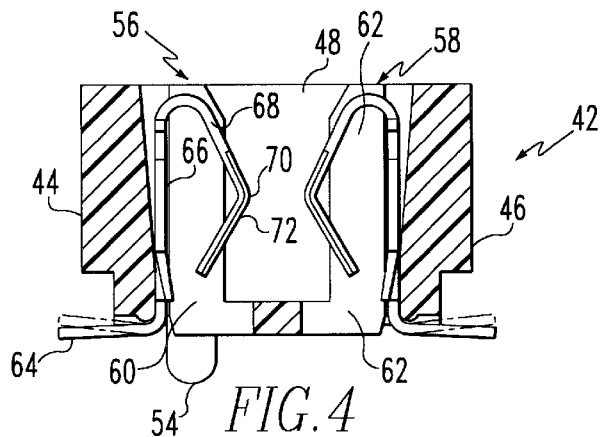
FIG. 4 is a transverse cross sectional view of a receptacle used with the vacuum pick up cap shown in FIG. 1.
Figure 8:
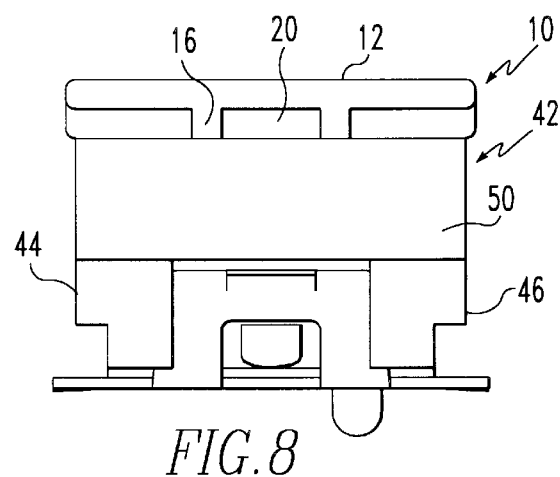
FIG. 8 is an end view of the composite vacuum pick up cap and receptacle shown in FIG. 5.
Figure 9:
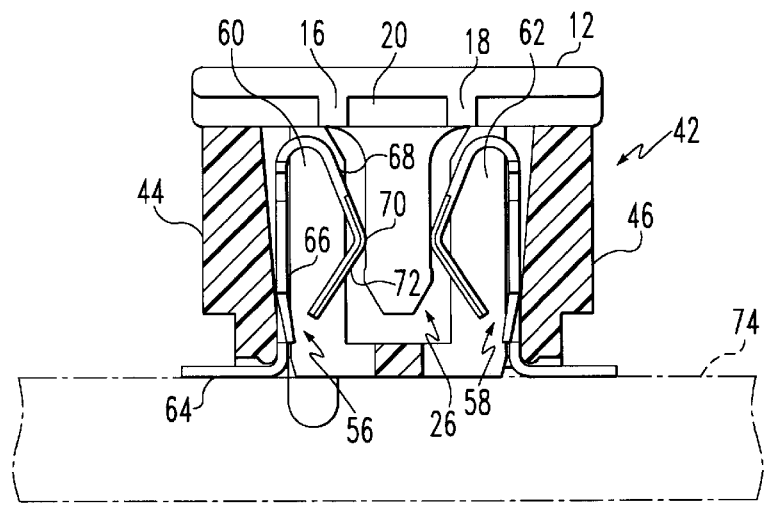
FIG. 9 is a cross sectional view through IX—IX in FIG. 7.
Figure 6:
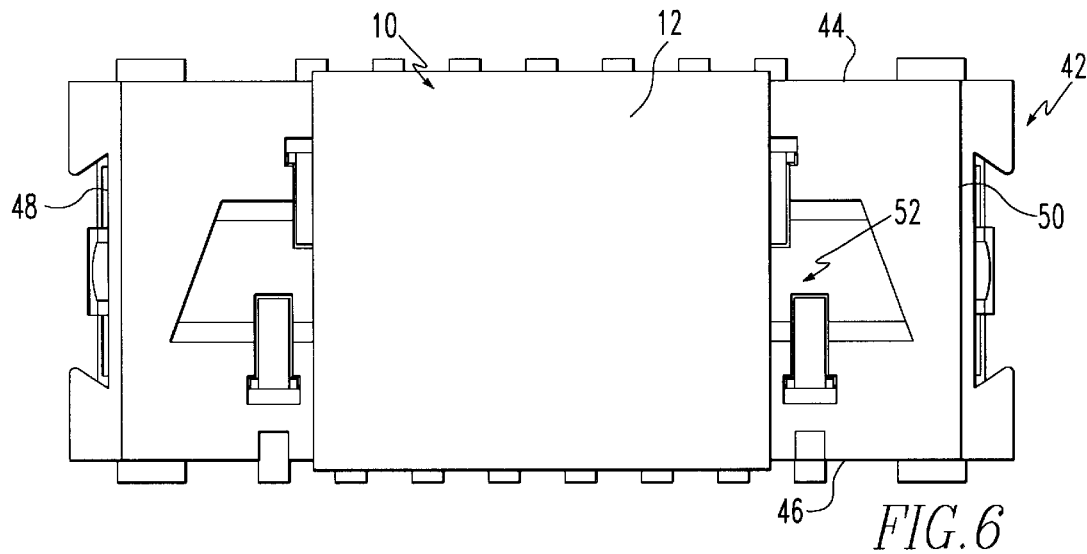
FIG. 6 is a top plan view of the composite vacuum pick up cap and receptacle shown in FIG. 5.
Figure 5:
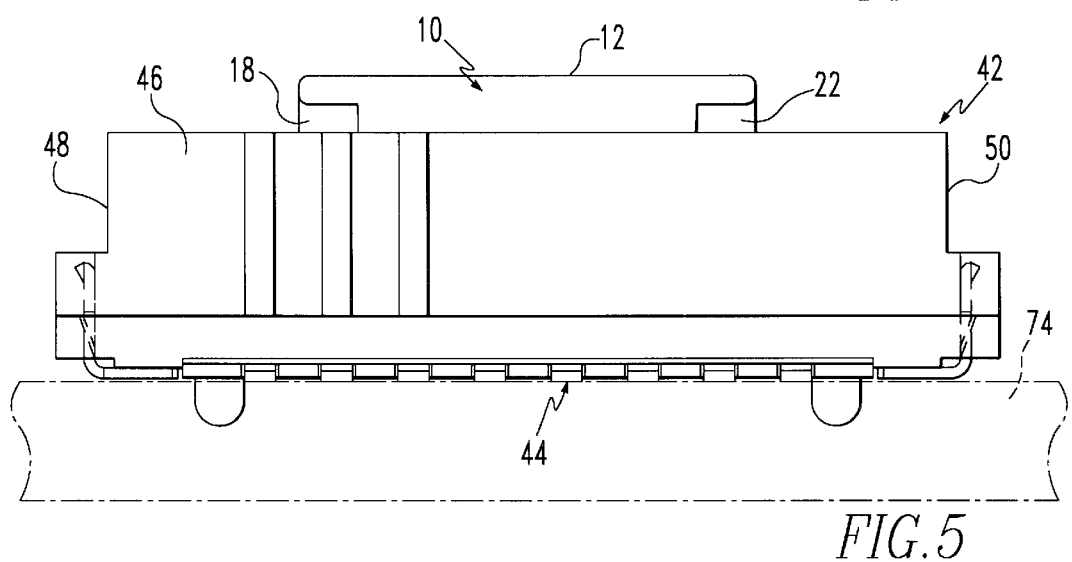
FIG. 5 is a side elevational view of the vacuum pick up cap shown in FIG. 1 engaged with the receptacle shown in FIG. 4.
Figure 7:
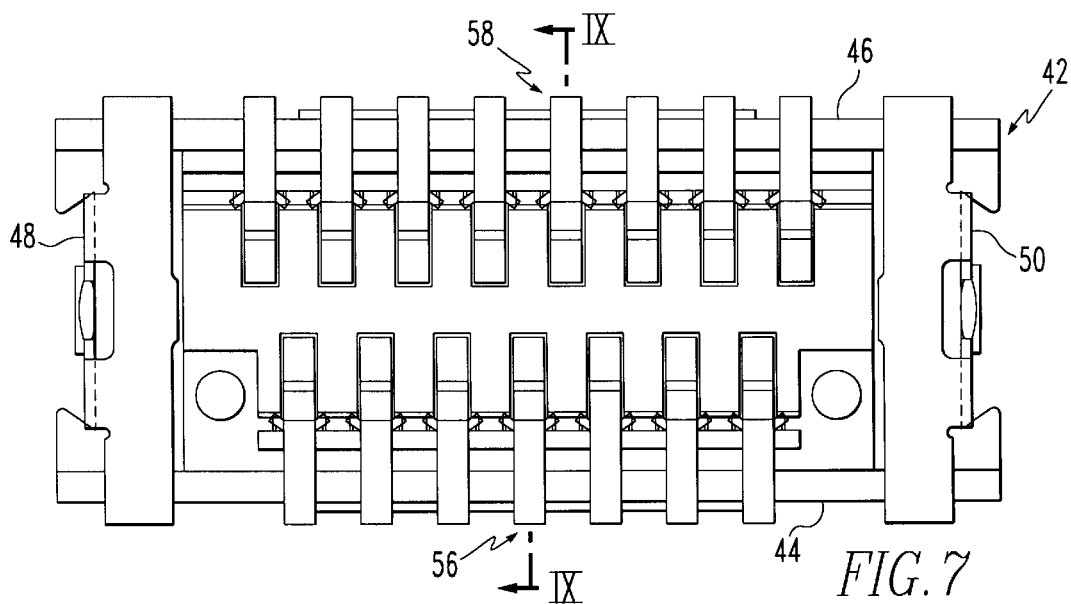
FIG. 7 is a bottom plan view of the composite vacuum pick cap and receptacle shown in FIG. 5.

Referring to FIGS. 1–3, the receptacle of the present invention includes a top section shown generally at numeral 10 which has an upper planar vacuum pick up surface 12 and an opposed projection surface 14. Extending downwardly from the end of the top section there are spaced projections 16 and 18 which form a finger grip 20. At the opposed end of the top section there is a first spaced projection 22 and a second spaced projection (not shown) which extend downwardly to form another finger grip 24. Extending downwardly from the opposed projection surface 14 there is a major elongated receptacle engaging projection 26. This receptacle engaging projection 26 has opposed vertical lateral side walls 28 and 30. Horizontal projections 32 and 34 extend respectively from the lateral sides 28 and 30. Beneath these projections there are sloped sides 36 and 38 and a horizontal lower terminal edge 40.

Referring to FIGS. 4–9, the vacuum pick up cap described above engages a receptacle shown generally at numeral 42. This receptacle has opposed side walls 44 and 46 and opposed end walls of 48 and 50. Between the opposed side walls 44 and 46 there is an elongated slot 52 in which projection 26 is received. The receptacle also includes a number of locating features as at feature 54 and opposed contacts as at contacts 56 and 58 which are separated by spacers as at spacers 60 and 62. Each of the contacts includes a solder tail 64, a vertical member 66, an oblique inwardly extending section 68, a contact point 70 and a terminal oblique outwardly extending section 72. As in conventional, this composite vacuum pick up cap and receptacle would be mounted on a PCB shown in phantom lines at numeral 74.

COMPARATIVE TEST

A test was conducted to compare the ability of the above described vacuum pick cap to maintain retention with its receptacle as compared with a conventional vacuum pick up cap and a second preferred embodiment of the vacuum pick up cap of this invention. The conventional cap is shown in FIG. 10a which has a top section shown generally at numeral 76 and a receptacle engaging projection shown generally at number 78. The receptacle engaging projection has opposed vertical lateral sides 80 and 82 and lower inwardly sloped sides 84 and 86. At its lower end there is an horizontal lower terminal edge 88.

An alternate preferred embodiment of the vacuum pick cap of this invention was also tested. This embodiment is shown in Fig. 10b and FIG. 11 and includes a top section shown generally numeral 90 and a lower receptacle engaging projection shown generally at numeral 92. The receptacle engaging projection has opposed outwardly sloped lateral sides 94 and 96. Adjacent the lower end of the projection there are inwardly sloped lateral sides 98 and 100 and at the bottom end of the projection there is an horizontal lower terminal edge 102.

Figure 12:
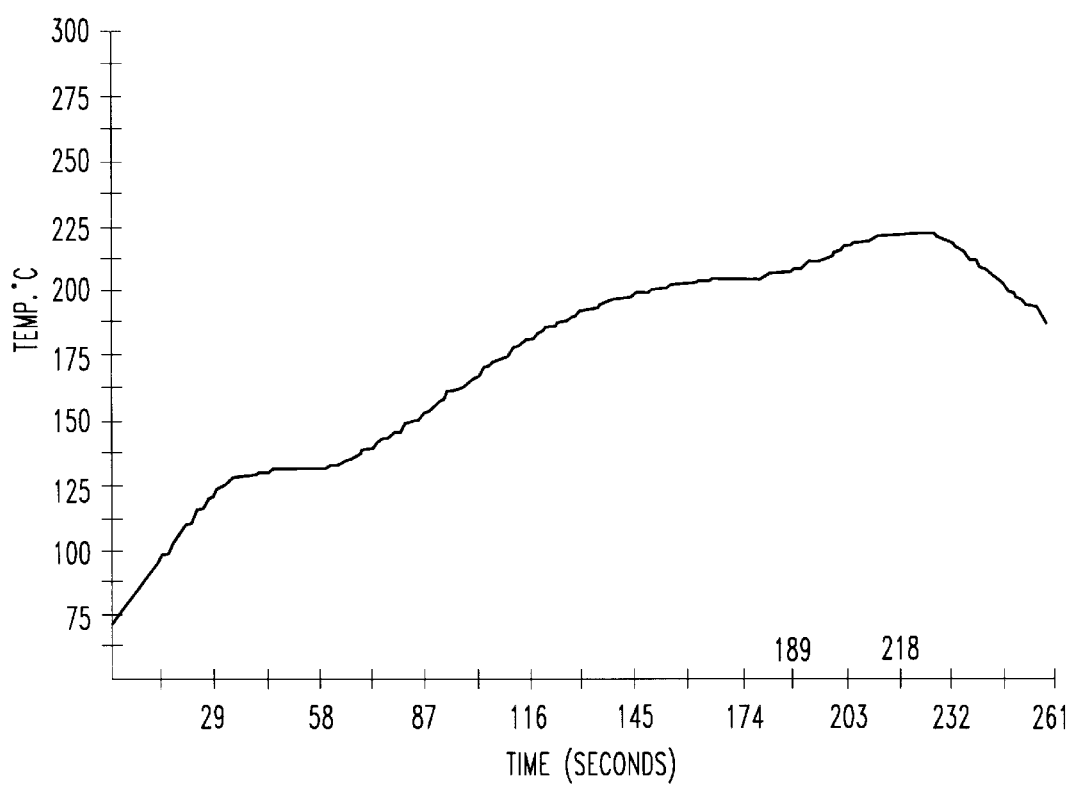
FIG. 12 is a solder curve used in a comparative test described herein.

The width of the receptacle engaging projection on the first preferred embodiment ($W_3$ in FIG. 3) was 0.032 inch and the projections (X in FIG. 3) each extended laterally by .0015 inch. The width of the projection ($W_2$ in FIG. 10a) of the conventional vacuum pick up cap was 0.032 inch. The maximum width of the projection of the second preferred embodiment ($W_3$ in FIG. 10b) was 0.033 inch. The minimum width of the projection of the second preferred embodiment ($W_4$ in 10b) was 0.032 inch. Each of the tested vacuum pick up caps weighed 5 grams and their material was DUPONT ZENITE 6130 liquid crystal polymer (LCP). Each of the tested vacuum pick up caps was engaged with a 69 position CONAN receptacle which is commercially available from Berg Electronics Group, Inc. located at St. Louis, Mo. The weight of these receptacles was 84 grams. About 30 vacuum pick up caps of each of the types shown in FIGS. 1, 10a and 10b were used to place the CONAN receptacles on PCB's, Each of these receptacles and engaged vacuum pick up caps was surface mounted on a PCB in an IR conveyor oven in which the solder curve shown in FIG. 12 was used. From FIG. 12 it will be seen that each of the receptacles were treated in the IR oven at a temperature of from about 75° C. to about 225° C. for more than about 180 seconds. After the receptacles were fixed to the PCB's by solder reflow, the PCB's were inverted and again conveyed through the IR oven. In an inverted position, it was found that both of the vacuum pick up caps of this invention (FIGS. 1 and 10b) continued to be securely retained in the receptacle while several of the prior art vacuum pick up caps (FIG. 10a) became disengaged.

Preferably the width of the receptacle will be from 0.010 inch to 0.100 inch. Preferably the lateral projection in the first preferred embodiment. (X in FIG. 3) will extend laterally from 0.001 inch to 0.010 inch. Preferably the difference in maximum and minimum projection width in the second preferred embodiment (difference between $W_3$ and $W_4$ in FIG. 10b) will be from 0.001 inch to 0.010 inch.

It will be appreciated that a vacuum pick up cap has been described which remains securely engaged with a receptacle during and after heating in an IR conveyor oven and which does not tend to be prematurely removed from the receptacle.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A method for attaching at least one receptacle comprising an insulative housing having spaced parallel walls forming therebetween a medial slot and which receptacle supports a plurality of conductive contacts on a printed circuit board (PCB) having opposed first and second sides comprising the steps of engaging the receptacle with a vacuum pick up cap consisting of a liquid crystal polymer (LCP) and comprising an upper section including a top surface, an elongated projection having opposed lateral sides with a width between said lateral sides and a terminal edge and extending downwardly from the cover to engage said receptacle in said slot and there being means for increasing the width of the projection adjacent the terminal edge of said projection by an amount of from about 0.001 inches to about 0.020 and then treating said first side of the PCB in an infrared (IR) oven at a temperature of from about 75° C. to about 225° C. for more than about 180 seconds to attach the receptacle to the first side of the PCB by solder reflow and then inverting said first side of the PCB to treat the second side of the PCB in the IR conveyor oven at a temperature of from about 75° C. to about 225°C. for more than about 180 seconds, whereby the vacuum pick up cap is unlikely to become disengaged from the receptacle when the first side of the PCB is inverted while the second side of the PCB is being treated.

* * * * *